(12) United States Patent
Gong et al.

(10) Patent No.: US 10,630,160 B2
(45) Date of Patent: Apr. 21, 2020

(54) GATE DRIVE ADAPTER

(71) Applicant: TEXAS INSTRUMENTS INCORPORATED, Dallas, TX (US)

(72) Inventors: Xun Gong, Freising (DE); Ingolf Frank, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/961,161

(22) Filed: Apr. 24, 2018

(65) Prior Publication Data
US 2019/0326806 A1 Oct. 24, 2019

(51) Int. Cl.
| | |
|---|---|
| H02M 1/08 | (2006.01) |
| H03K 17/687 | (2006.01) |
| H02M 3/335 | (2006.01) |
| H02M 3/07 | (2006.01) |
| H03K 17/567 | (2006.01) |
| H01L 27/06 | (2006.01) |
| H01L 29/16 | (2006.01) |

(52) U.S. Cl.
CPC ............... *H02M 1/08* (2013.01); *H02M 3/07* (2013.01); *H02M 3/33553* (2013.01); *H03K 17/6871* (2013.01); *H01L 27/0635* (2013.01); *H01L 29/1608* (2013.01); *H02M 2003/071* (2013.01); *H03K 17/567* (2013.01)

(58) Field of Classification Search
CPC ...... H02M 1/08; H02M 3/33553; H02M 3/07; H02M 2003/071; H03K 17/6871; H03K 17/567; H01L 27/0635; H01L 29/1608
See application file for complete search history.

(56) References Cited

U.S. PATENT DOCUMENTS

| | | | |
|---|---|---|---|
| 5,168,174 A | 12/1992 | Naso et al. | |
| 6,906,552 B2* | 6/2005 | Ajit | H03K 19/00315 |
| | | | 326/63 |
| 2008/0036531 A1* | 2/2008 | Boe | H02M 3/07 |
| | | | 327/538 |
| 2011/0248691 A1 | 10/2011 | Williams | |
| 2012/0001609 A1 | 1/2012 | Shiraishi et al. | |
| 2012/0120688 A1 | 5/2012 | Hoon et al. | |
| 2017/0012626 A1* | 1/2017 | Dighrasker | H03K 17/08 |

(Continued)

OTHER PUBLICATIONS

International Rectifier, Datasheet for IRS2001, Aug. 2008, International Rectifier, Rev. A, 1-15 (Year: 2008).*

(Continued)

*Primary Examiner* — Jue Zhang
(74) *Attorney, Agent, or Firm* — Tuenlap Chan; Charles A. Brill; Frank D. Cimino

(57) ABSTRACT

A gate drive adapter circuit includes an input circuit, an output circuit, and a charge pump circuit. The input circuit is configured to receive pulses suitable for controlling a silicon power transistor. The output circuit is coupled to the input circuit. The output circuit is configured to translate the pulses to voltages suitable for controlling a silicon-carbide power transistor. The charge pump circuit is coupled to the input circuit and to the output circuit. The charge pump circuit is configured to generate a negative voltage. The output circuit is configured to apply the negative voltage to translate the pulses.

4 Claims, 6 Drawing Sheets

(56) References Cited

U.S. PATENT DOCUMENTS

2018/0241391 A1* 8/2018 Chandrasekaran ..... H02M 3/07

OTHER PUBLICATIONS

Ye, Zichao et al. "Design and Implementation of a Low-Cost and Compact Floating Gate Drive Power Circuit for GaN-Based Flying Capacitor Multi-Level Converters." IEEE APEDC 2017 (AR 793112). Search Report for PCT Application No. PCT/US19/28926, dated Aug. 29, 2019, 1 page.

* cited by examiner

GATE DRIVE ADAPTER

BACKGROUND

A switch-mode power supply is an electronic circuit that converts an input direct current (DC) voltage into one or more DC output voltages that are higher or lower in magnitude than the input DC supply voltage. A switch-mode power supply that generates an output voltage lower than the input voltage is termed a buck or step-down converter. A switch-mode power supply that generates an output voltage higher than the input voltage is termed a boost or step-up converter.

A switch-mode power supply includes a switch for alternately opening and closing a current path through an inductor in response to a switching signal. In operation, a DC voltage is applied across the inductor. Electrical energy is transferred to a load connected to the inductor by alternately opening and closing the switch as a function of the switching signal. The amount of electrical energy transferred to the load is a function of the duty cycle of the switch and the frequency of the switching signal. The switch may be implemented using a silicon transistor or a silicon-carbide transistor.

SUMMARY

A gate drive adapter circuit for controlling a silicon carbide power transistor using a controller designed to drive a silicon power transistor is disclosed herein. In one example, a gate drive adapter circuit includes an input circuit, an output circuit, and a charge pump circuit. The input circuit is configured to receive pulses suitable for controlling a silicon power transistor. The output circuit is coupled to the input circuit. The output circuit is configured to translate the pulses to voltages suitable for controlling a silicon-carbide power transistor. The charge pump circuit is coupled to the input circuit and to the output circuit. The charge pump circuit is configured to generate a negative voltage. The output circuit is configured to apply the negative voltage to translate the pulses.

In another example, a silicon-carbide transistor adapter includes an input terminal, an output terminal, a capacitor, a first transistor, and a second transistor. The capacitor includes a first terminal, and a second terminal. The first transistor includes a base terminal, an emitter terminal, and a collector terminal, where the base terminal is coupled to the input terminal, the emitter terminal is coupled to the output terminal, and the collector terminal is coupled to the second terminal of the capacitor. The second transistor includes a base terminal that is coupled to the input terminal, and an emitter terminal that is coupled to the first terminal of the capacitor.

In a further example, a switch-mode power supply includes a power supply controller, a gate drive adapter circuit, and a silicon carbide power transistor. The power supply controller includes a silicon transistor gate driver. The gate drive adapter circuit is coupled to a silicon transistor drive output of the power supply controller. The silicon carbide power transistor is coupled to a silicon carbide transistor drive output of the gate drive adapter circuit. The gate drive adapter circuit includes a charge pump circuit and an output circuit. The charge pump circuit is configured to generate a negative voltage for controlling the silicon carbide power transistor. The negative voltage is generated using pulses received via the silicon transistor drive output of the power supply controller. The output circuit is coupled to the charge pump circuit. The output circuit is configured to translate pulses received via the silicon transistor drive output of the power supply controller to voltages for controlling the silicon carbide power transistor. The voltages include the negative voltage generated by the charge pump.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Silicon carbide power transistors (e.g., silicon carbide metal oxide semiconductor field effect transistors (MOSFETs)) provide a number of advantages over silicon power transistors (e.g., silicon MOSFETs). For example, silicon carbide power transistors may provide faster switching and lower on resistance than silicon transistors, which translates into higher efficiency, operation at higher temperatures, less heatsinking, smaller size and weight, and low cost. However, the drive requirements of silicon carbide power transistors are different from those of silicon power transistors. For example, while a silicon power transistor may turn on and off with 10-15 volts and 0 volts respectively, a silicon carbide power transistor may turn on and off with 20 volts and −5 volts respectively.

Various circuit implementations use transformers or isolated gate drivers to isolate the silicon carbide transistor drive circuitry from the pulse width modulator and other circuitry that generates control for the silicon carbide power transistor. However, use of transformers or isolated gate drivers can significantly increase system cost, signal propagation delay, and/or signal transition time.

The gate drive adapter circuits disclosed herein allow circuitry designed to drive a silicon power transistor to drive a silicon carbide power transistor. No isolation is needed with implementations of the gate drive adapter circuit. Advantageously, system cost and signal propagation time is reduced, and fast transitions are provided on all drive signal edges. The gate drive adapter circuits produce the negative voltage needed to drive the silicon carbide power transistor, so no external negative voltage power supply is needed, which further reduces system cost and size.

Figure 1:
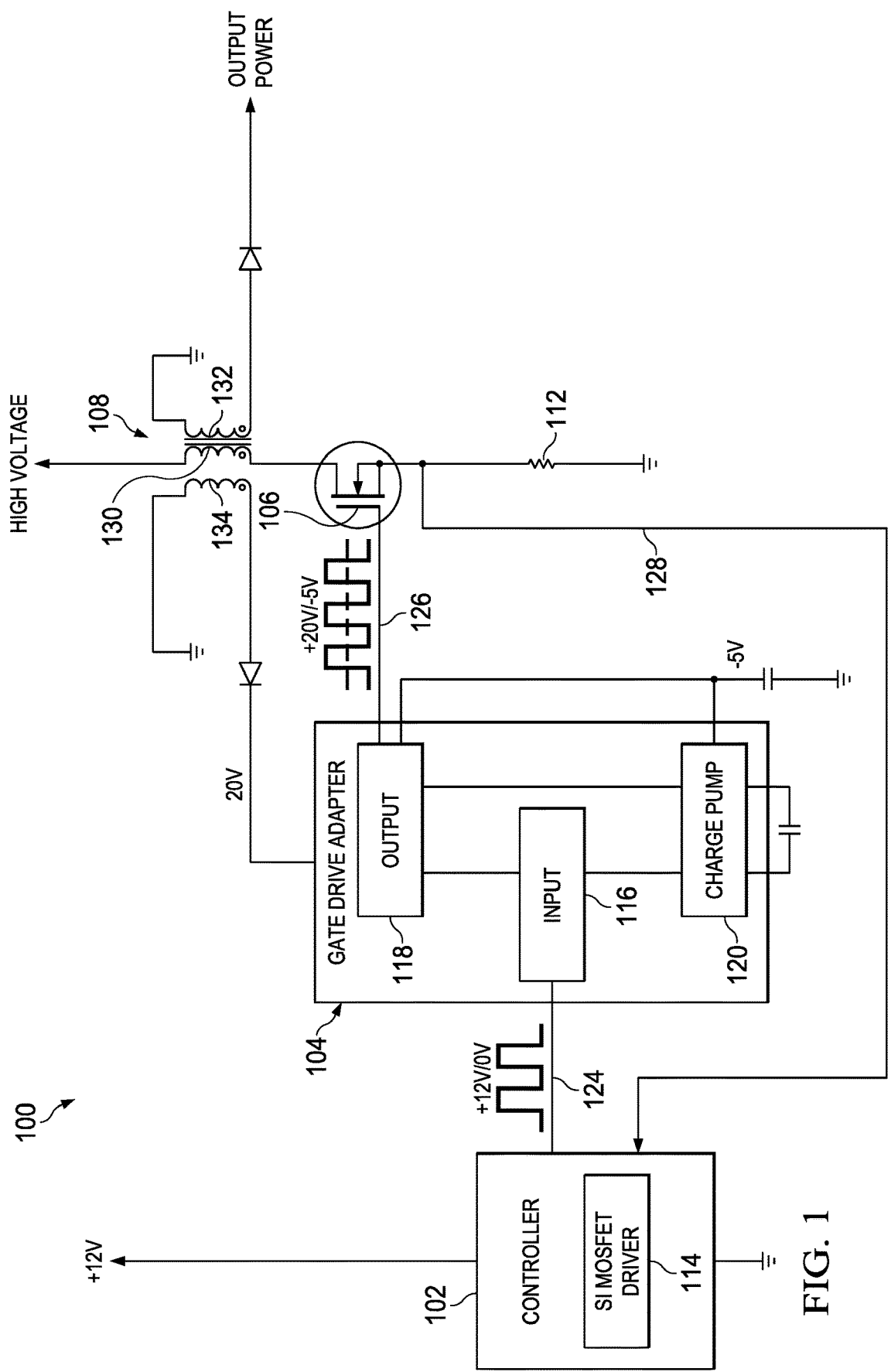
FIG. 1 shows a block diagram for an example of a switch-mode power supply that includes a silicon carbide power transistor in accordance with the present disclosure.

FIG. 1 shows a block diagram for an example of a switch-mode power supply 100 that includes a silicon carbide power transistor in accordance with the present disclosure. The switch-mode power supply 100 includes a power supply controller 102, a gate drive adapter circuit 104, a silicon carbide power transistor 106, and a transformer 108. In some examples of the switch-mode power supply 100, the controller 102 is implemented as a first integrated circuit, the gate drive adapter 104 is implemented as a second integrated circuit separate from the controller 102, and the silicon carbide power transistor 106 is a discrete device. The power supply controller 102 includes circuitry to control the timing of switching of the silicon carbide power transistor 106 to produce a desired energy transfer through transformer 108. For example, the power supply controller 102 may include circuitry that compares a sense signal 128 (e.g., voltage across a sense resistor 112 that couples the source of the silicon carbide power transistor 106 to ground) produced at an output of the silicon carbide power transistor 106 to a reference voltage, and include a pulse width modulator that varies output pulse width as a function of the comparator output. The power supply controller 102 includes a driver 114 that produces an output signal suitable for driving (i.e., suitable for controlling) a silicon transistor (e.g., a silicon MOSFET). The pulses generated by the pulse width modulator are received by the driver 114, and conditioned by the driver 114 to drive a silicon transistor. For example, the silicon transistor drive signal 124 produced by the driver 114 may swing from 0 volts and 12 volts to drive a silicon power transistor.

The silicon carbide power transistor 106 is coupled to the transformer 108. When the silicon carbide power transistor 106 is switched on, current flows through a winding 130 of the transformer 108 to ground. When the silicon carbide power transistor 106 is switched off, the current flow through the winding 130 of the transformer 108 to ground is interrupted. Instead, current flows in the secondary windings 132 and 134 of the transformer 108 to provide output power and/or bias power. The silicon transistor drive signal 124 generated by the power supply controller 102 may be unsuitable for driving the silicon carbide power transistor 106. For example, while a silicon power transistor may be fully turned on and off with gate voltages of 12 volts and 0 volts, respectively, the silicon carbide power transistor 16 may require a voltage higher than 12 volt to fully turn on and a gate voltage less than 0 volts to fully turn off. Some examples of the silicon carbide power transistor 106 may operate efficiently with a gate voltage of about negative 5 volts to turn off the transistor and a gate voltage of about 20 volts to turn on the transistor.

The gate drive adapter circuit 104 is an adapter for the silicon carbide power transistor 106. The gate drive adapter circuit 104 is coupled to the silicon transistor drive output of the power supply controller 102, and receives as input the silicon transistor drive signal 124 generated by the power supply controller 102. The gate drive adapter circuit 104 translates the silicon transistor drive signal 124 received from the power supply controller 102 to voltages suitable for driving the silicon carbide power transistor 106. An output of the gate drive adapter circuit 104 is coupled a control terminal (e.g., a gate terminal) of the silicon carbide power transistor 106, and a silicon carbide transistor drive signal 126 generated by the gate drive adapter circuit 104 swings from about −5 volts to about 20 volts to efficiently drive the silicon carbide power transistor 106.

The gate drive adapter circuit 104 includes input circuitry 116, output circuitry 118, and charge pump circuitry 120. The input circuitry receives the silicon transistor drive signal 124 generated by the power supply controller 102. The charge pump circuitry 120 produces the negative voltage needed to turn off the silicon carbide power transistor 106. The output circuitry 118 applies a high power supply voltage input (e.g., 20 volts) and the negative voltage generated by the charge pump circuitry 120 to translate the silicon transistor drive signal 124 to the silicon carbide transistor drive signal 126.

Figure 2:
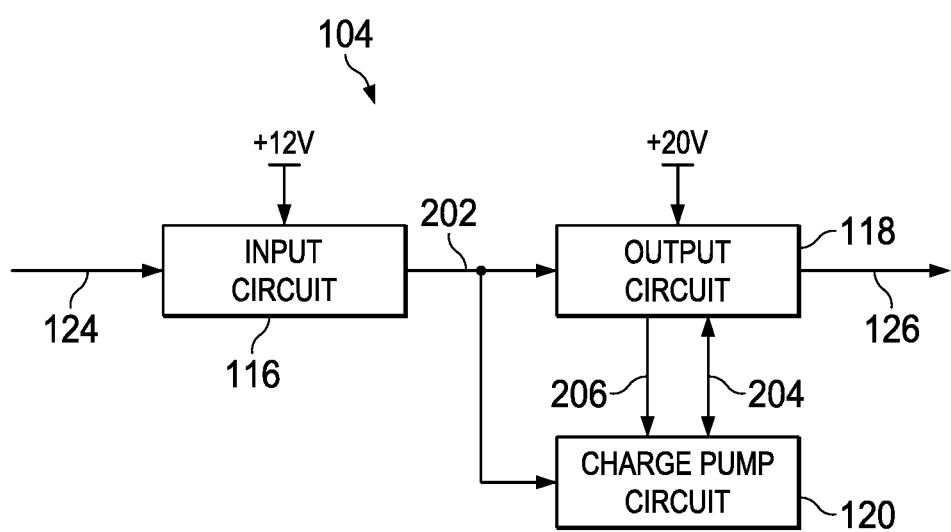
FIG. 2 shows a block diagram for an example of gate drive adapter to drive a silicon carbide power transistor from a silicon transistor driver in accordance with the present disclosure.

FIG. 2 shows a block diagram for an example of the gate drive adapter circuit 104. The input circuitry 116 is powered by a low voltage power supply (e.g., 12 volts) that may be used to power the driver 114 of the power supply controller 102. In some implementations, a portion of the input circuitry 116 may be powered by the high voltage bias power supply (e.g., 20 volts) that powers the output circuitry 118. The input circuitry 116 may include circuitry that buffers the silicon transistor drive signal 124 to increase the current driving the output circuitry 118, and/or circuitry that increases or shifts the voltage of the silicon transistor drive signal 124 to better drive the output circuitry 118. The output signal 202 produced by the input circuitry 116 drives the output circuitry 118 and the charge pump circuitry 120. As noted above, the output signal 202 may be a buffered and/or voltage shifted version of the silicon transistor drive signal 124.

The charge pump circuitry 120 applies the output signal 202 as a timing signal for generating the negative voltage 204 needed to drive the silicon carbide power transistor 106. In some implementations of the charge pump circuitry 120, switching circuitry in the charge pump circuitry 120 may be controlled by the output signal 202 to produce and provide the negative voltage 204 to the output circuitry 118 only when needed by the output circuitry 118 to drive the silicon carbide power transistor 106. For example, while the output signal 202 is at a logic "high" voltage, the negative voltage 204 is not needed to drive the silicon carbide power transistor 106 and the charge pump circuitry 120 may not generate the negative voltage 204. While the output signal 202 is at a logic "low" voltage, the negative voltage 204 is needed to drive the silicon carbide power transistor 106 and the charge pump circuitry 120 may generate the negative voltage 204. Because the negative voltage 204 is generated only when needed, the power consumed by the charge pump circuitry 120 may be reduced relative to implementations that provide constant negative voltage.

The output circuitry 118 applies the output signal 202 to produce the silicon carbide transistor drive signal 126. The output circuitry 118 switches a high voltage bias power supply (e.g., 20 volts) to increase the voltage of the silicon carbide transistor drive signal 126 (relative to the silicon transistor drive signal 124) needed to turn on the silicon carbide power transistor 106. The output circuitry 118 switches the negative voltage 204 generated by the charge pump circuitry 120 to decrease the voltage of the silicon carbide transistor drive signal 126 (relative to the silicon transistor drive signal 124) needed to turn off the silicon carbide power transistor 106. In some implementations, an output signal 206 of the output circuitry 118 may be provided to the charge pump circuitry 120 for generation of the negative voltage. For example, a portion of the high voltage drive generated by the output circuitry 118 may be applied to charge a reservoir capacitor of the charge pump circuitry 120 that is used to produce the negative voltage 204.

Figure 3:
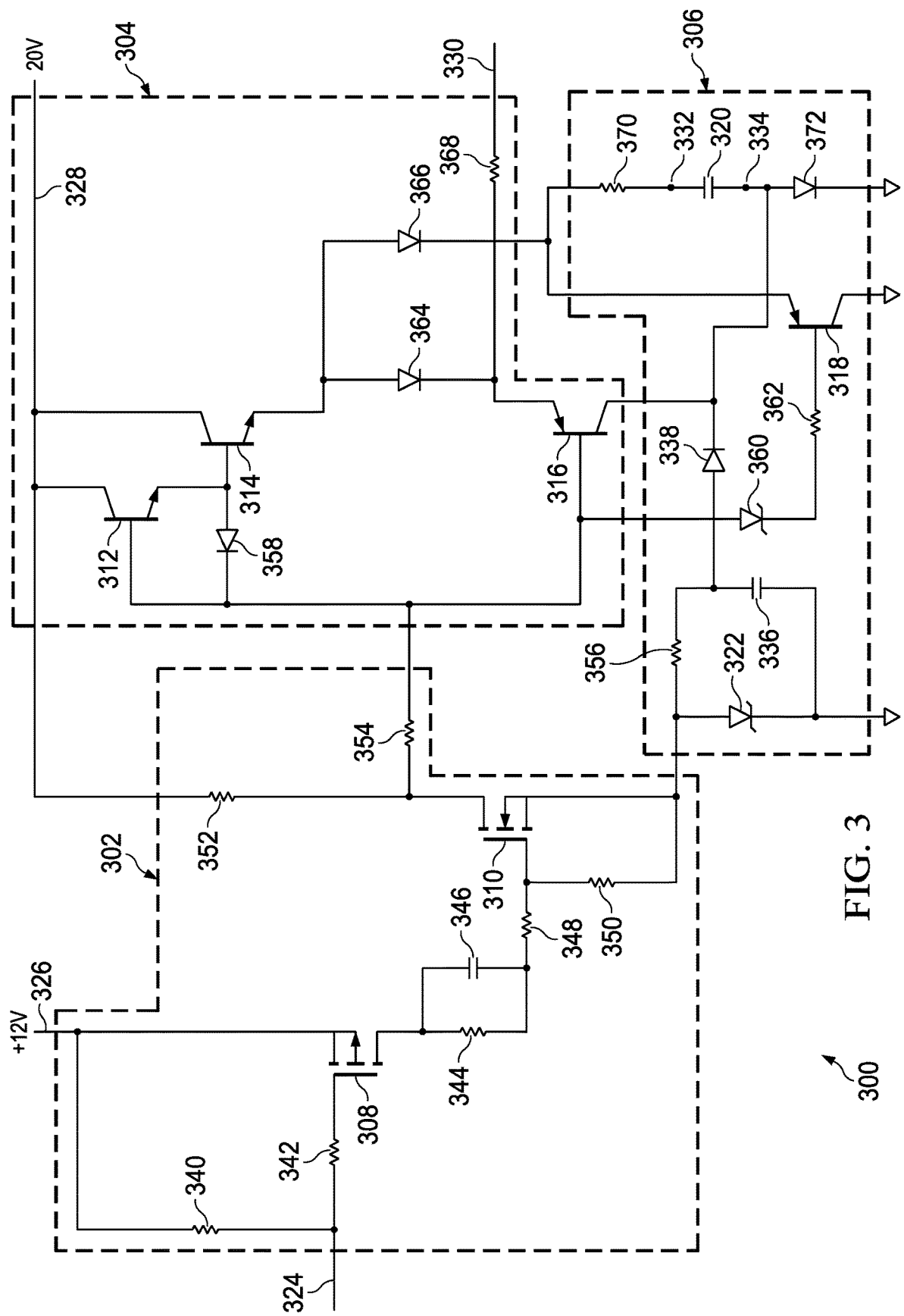
FIG. 3 shows a schematic diagram for an example of a gate drive adapter to drive a silicon carbide power transistor from a silicon transistor driver in accordance with the present disclosure.

FIG. 3 shows a schematic diagram for an example of a gate drive adapter 300 that drives a silicon carbide power transistor from a silicon transistor driver in accordance with the present disclosure. The gate drive adapter 300 is an implementation of the gate drive adapter circuit 104. The gate drive adapter 300 includes an input circuit 302, an output circuit 304, and a charge pump circuit 306. The input circuit 302 is an implementation of the input circuitry 116, the output circuit 304 is an implementation of the output circuitry 118, and the charge pump circuit 306 is an implementation of the charge pump circuitry 120. The input circuit 302 includes a transistor 308 and a transistor 310. The transistor 308 may be a p-channel MOSFET and the transistor 310 may be an n-channel MOSFET.

The transistor 308 is arranged as a high-side inverter that receives the silicon transistor drive signal 124 as input and produces an inverted version of the silicon transistor drive signal 124 as output. The transistor 308 can be a p-type transistor, and it includes a control terminal (e.g., a gate terminal) that is coupled to a signal input terminal 324 of the gate drive adapter 300, via a resistor 342, to receive the silicon transistor drive signal 124. An input terminal (e.g., a source terminal) of the transistor 308 is coupled to a driver low-voltage power supply terminal 326 (coupled to a silicon transistor driver high-side power rail that sets the high-side voltage of the silicon transistor drive signal 124) of the gate drive adapter 300. The control terminal of the transistor 308 is coupled to the silicon transistor driver high-side power rail by the resistor 340. An output terminal of the transistor 308 is coupled to the transistor 310, via a resistor 344 and a capacitor 346 connected in parallel, and a resistor 358.

The transistor 310 is arranged as a low-side inverter that receives the output of the transistor 308 as input and produces an inverted version of the output of the transistor 308 as output. The transistor 310 can be an n-type transistor, and it includes a control terminal (e.g., a gate terminal) that is coupled to the output terminal of the transistor 308. An input terminal (e.g., a drain terminal) of the transistor 310 is coupled to a driver high-voltage power supply terminal 328 (a silicon carbide transistor high gate voltage supply rail) of the gate drive adapter 300, via a resistor 352, to allow the output of the transistor 310 to swing to the voltage needed to fully turn on the silicon carbide transistor 106. In this example, 20 volts is provided at the driver high-voltage power supply terminal 328. The input terminal of the transistor 310, which serves as the output of the input circuit 302, is also coupled to the output circuit 304 via a resistor 354. An output terminal of the transistor 310 is coupled to the charge pump circuit 306. The control terminal of the transistor 310 is also coupled to the charge pump circuit 306 via a resistor 350.

The output circuit 304 includes push-pull circuitry that includes a high-side output transistor 314 and a low-side output transistor 316. The high-side output transistor 314 pulls the signal output terminal 330 up to the voltage provided at the driver high-voltage power supply terminal 328, and the low-side output transistor 316 pulls the signal output terminal 330 down to the voltage provided by the charge pump circuit 306. When the output of the input circuit 302 is "high", the high-side output transistor 314 is activated, and when the output of the input circuit 302 is "low," the low-side output transistor 316 is activated.

The high-side output transistor 314 may be driven by a transistor 312 to form a Darlington pair in some implementations. The transistor 312 and the high-side output transistor 314 may be negative-positive-negative (NPN) bipolar junction transistors, and the low-side output transistor 316 may be a positive-negative-positive (PNP) bipolar junction transistor. The high-side output transistor 314 includes a control terminal (e.g., a base terminal) that is coupled to the input circuit 302 (e.g., coupled to an input terminal (e.g., a drain terminal) of the transistor 310 via a diode 358), an input terminal (e.g., a collector terminal) coupled to the driver high-voltage power supply terminal 328, and an output terminal (e.g., an emitter terminal) coupled to the signal output terminal 330 via a diode 364 and a resistor 368. The control terminal of the high-side output transistor 314 is driven by the transistor 312. A control terminal of the transistor 312 is coupled to the input circuit 302 (e.g., coupled to an input terminal (e.g., a drain terminal) of the transistor 310), an input terminal (e.g., a collector terminal) of the transistor 312 is coupled to the driver high-voltage power supply terminal 328, and an output terminal of the transistor 312 is coupled to the control terminal of the high-side output transistor 314.

The low-side output transistor 316 is coupled to the input circuit 302, the charge pump circuit 306, and the signal output terminal 330. The low-side output transistor 316 includes a control terminal (e.g., a base terminal) that is coupled to the input circuit 302 (e.g., coupled to an input terminal of the transistor 310), an input terminal (e.g., an emitter terminal) coupled to the signal output terminal 330 via the resistor 368, and an output terminal (e.g., a collector) coupled to the charge pump circuit 306.

The charge pump circuit 306 includes a reservoir capacitor 320 and a switching transistor 318. The switching transistor 318 may be a PNP bipolar junction transistor. The reservoir capacitor 320 accumulates charge with the switching of the high-side output transistor 314. The reservoir capacitor 320 includes a top plate that is coupled to the output terminal of the high-side output transistor 314, via a diode 366, and bottom plate that is coupled to ground through a diode. When the high-side output transistor 314 is turned on, the reservoir capacitor 320 is charged. Thus, the reservoir capacitor 320 is charged as a function of the pulses of the silicon transistor drive signal received at the signal input terminal 324.

The top plate of the reservoir capacitor 320 is also coupled to an input terminal of the switching transistor 318, via a resistor 370. An output terminal of the switching transistor 318 is coupled to ground, and the control terminal of the switching transistor 318 is coupled to the input circuit 302 (e.g., coupled to the input terminal of the transistor 310), via a Zener diode 360 and a resistor 362. When the output of the input circuit 302 is "low," the switching transistor 318 is activated to connect the top plate of the reservoir capacitor 320 to ground and produce a negative voltage on the bottom plate of the reservoir capacitor 320. Thus, the charge pump circuit 306 produces the negative voltage only while the low-side output transistor 316 is active to drive the signal output terminal 330. The peak negative voltage provided on the bottom plate of the reservoir capacitor 320 is captured through diode 338 and stored in a second reservoir capacitor 336. This captured voltage is regulated by a Zener diode 322, via a resistor 356, to provide a constant negative voltage reference for the transistor 310. For example, the Zener diode 322 may limit the negative voltage to be no lower than −6.2 volts.

Portions of the gate drive adapter 300 may be implemented as an integrated circuit. For example components of the gate drive adapter 300, other than the capacitors, may be implemented in an integrated circuit. In such implementations, the gate drive adapter 300 includes a capacitor top plate connection terminal 332 and a capacitor bottom plate connection terminal 334. The reservoir capacitor 320 is connected to the capacitor top plate connection terminal 332 and a capacitor bottom plate connection terminal 334.

Figure 4:
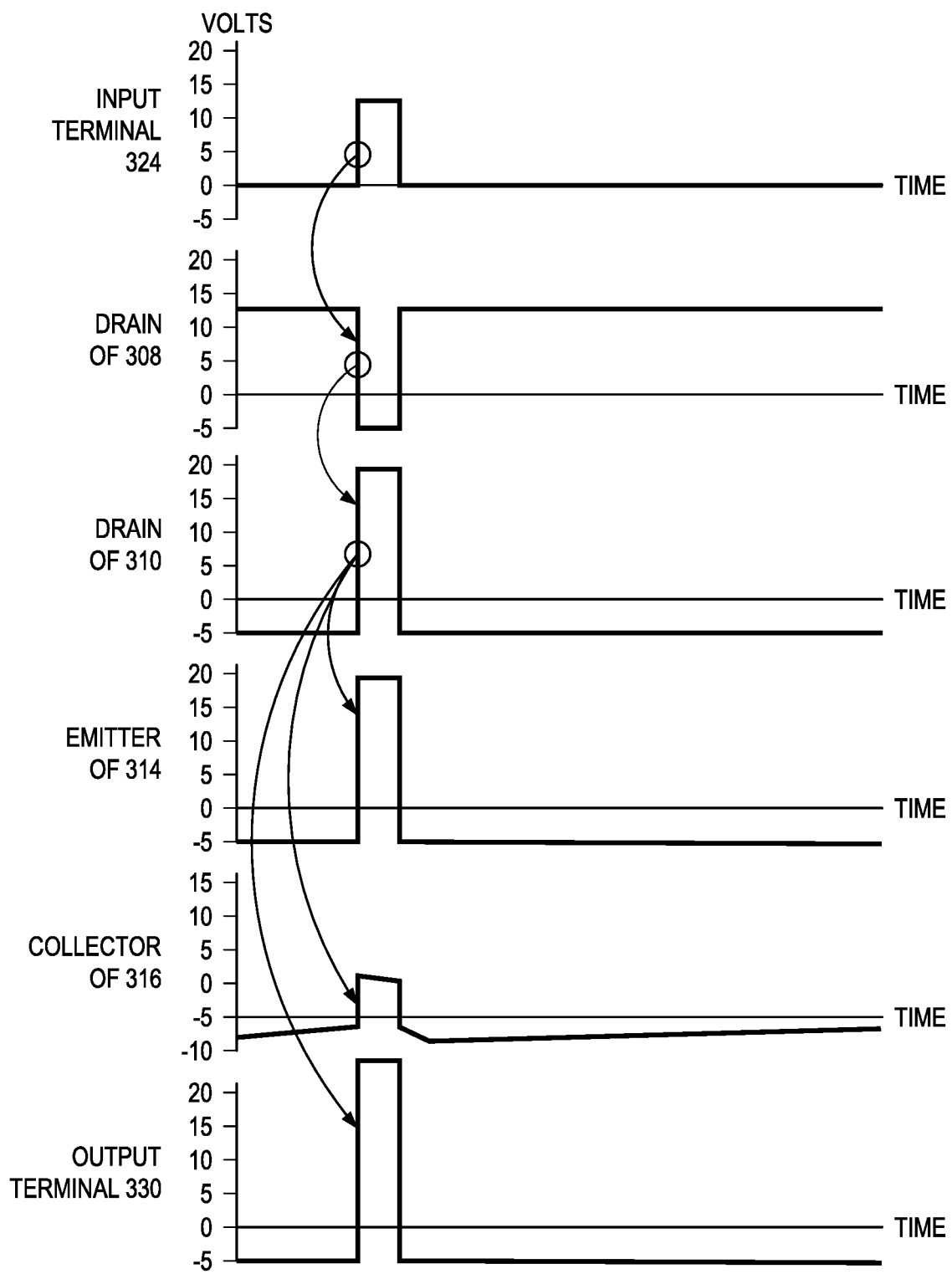
FIG. 4 shows an example of signals generated in a gate drive adapter for driving a silicon carbide power transistor from a silicon transistor driver in accordance with the present disclosure.

FIG. 4 shows an example of signals generated by the gate drive adapter 300. The silicon transistor drive signal 124 received at the signal input terminal 324 swings from 0 volts to 12 volts and turns on and off the transistor 308 to generate a signal at the drain of the transistor 308. The signal generated at the drain of the transistor 308 turns on and off the transistor 310 to generate a signal at the drain of the transistor 310. The signal generated at the drain of the transistor 310 turns on and off the transistors 314 and 316 to generate signals at the emitters of the transistors 314 and 316, which produce the silicon carbide transistor drive signal 126 at the output terminal 330. The silicon carbide transistor drive signal 126 swings from about −5 volts to about +20 volts.

Figure 5:
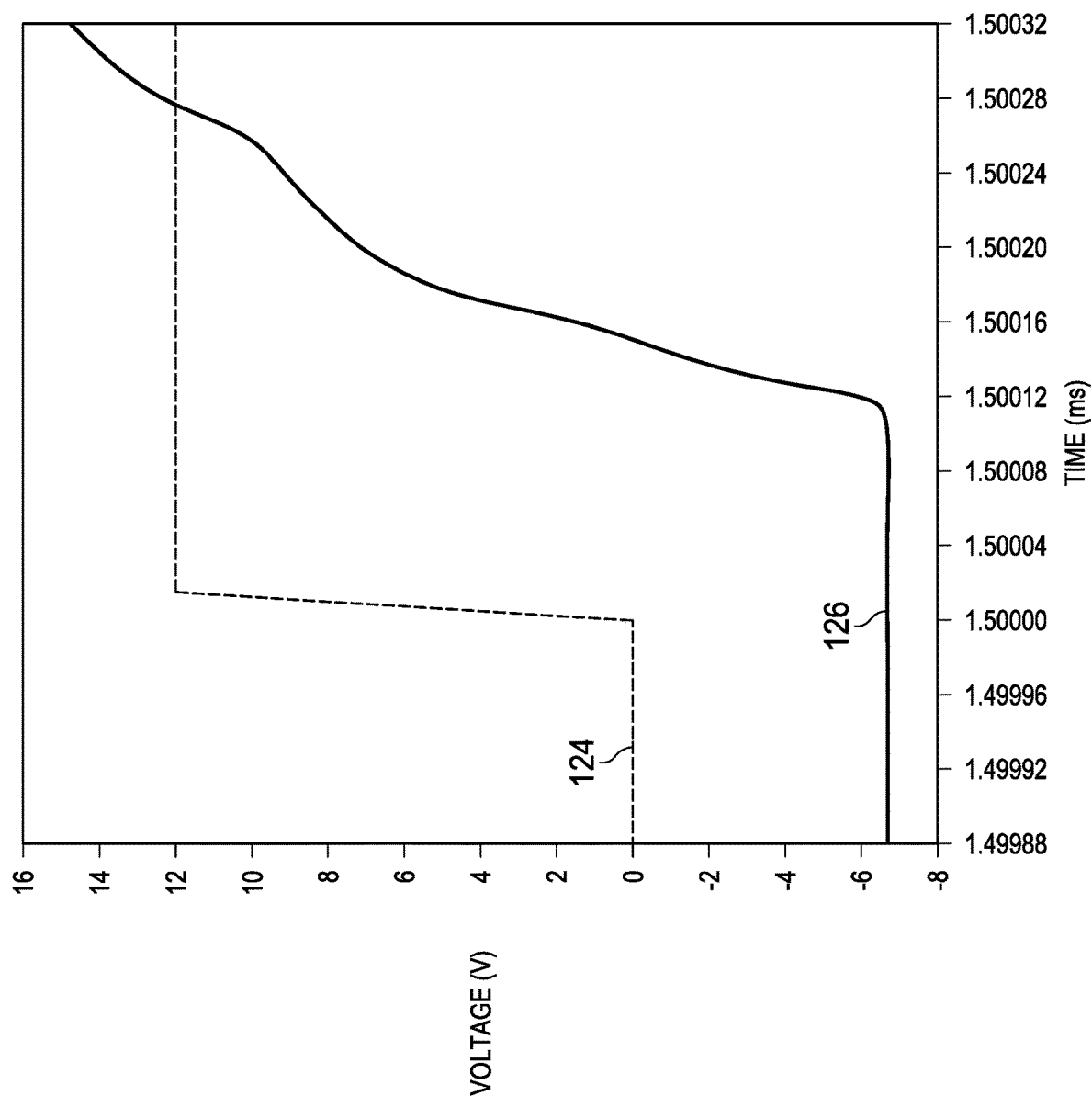
FIG. 5 shows an example of output signal transition of a gate drive adapter for driving a silicon carbide power transistor from a silicon transistor driver in accordance with the present disclosure.

FIG. 5 shows an example of a signal transition of the silicon carbide transistor drive signal 126 produced by the gate drive adapter 300. Advantageously, the propagation delay in the gate drive adapter 300 is about 98 nano-seconds, and the transition time of the silicon carbide transistor drive signal 126 is about 150 nano-seconds.

Figure 6:
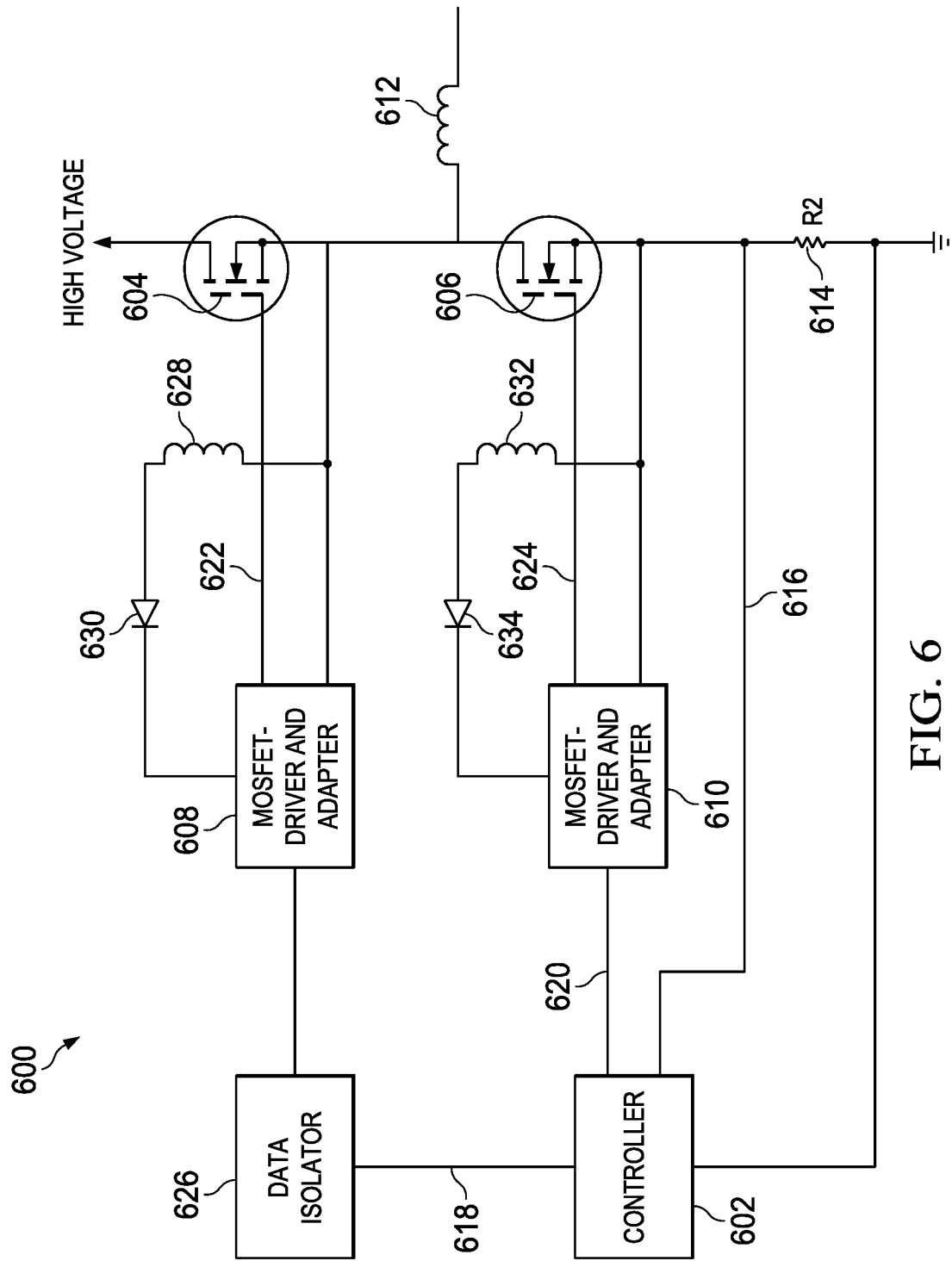
FIG. 6 shows a partial block diagram for an example of a half-bridge switch-mode power supply that includes silicon carbide power transistors in accordance with the present disclosure.

The gate drive adapter 300 may be used in variety of applications that include silicon carbide power transistors. FIG. 6 shows a partial block diagram for an example of a half-bridge switch-mode power supply 600 that includes silicon carbide power transistors. The half-bridge switch-mode power supply 600 includes a power supply controller 602, a high-side silicon carbide power transistor 604, a low-side silicon carbide power transistor 606, a high-side gate drive adapter circuit 608, a low-side gate drive adapter circuit 610, an inductor 612, and a sense resistor 614. The power supply controller power supply controller 602 includes circuitry to control the timing of switching of the silicon carbide power transistors 604 and 606. For example, the power supply controller power supply controller 602 may include circuitry that compares a sense signal 616 (e.g., voltage across the sense resistor 614 that couples the source of the low-side silicon carbide power transistor 606 to ground) produced at the source terminal of the low-side silicon carbide power transistor 606 to a reference voltage, and include a pulse width modulator that varies output pulse width as a function of the comparator output. The power supply controller 602 includes drivers that produce output signals suitable for driving silicon transistors (e.g., silicon MOSFETs). For example, the signals 618 and 620 produced by the controller power supply controller 602 may swing from 0 volts and 12 volts to drive silicon power transistors.

The high-side silicon carbide power transistor 604 and the low-side silicon carbide power transistor 606 are connected in a push-pull arrangement to drive the inductor 612. The silicon transistor drive signals 618 and 620 generated by the power supply controller power supply controller 602 may be unsuitable for driving the silicon carbide power transistors high-side silicon carbide power transistor 604 and 606. For example, the silicon carbide power transistors 604 and 606 may operate more efficiently with a signal swing from about negative 5 volts to about positive 20 volts.

The gate drive adapter circuits 608 and 610 are implementations of the gate drive adapter 104 and the gate drive adapter 300. The gate drive adapter circuits 608 and 610 respectively translate the silicon transistor drive signals 618 and 620 received from the power supply controller 602 to voltages suitable for driving the silicon carbide power transistors 604 and 606.

The gate drive adapter circuit 608 is coupled to the power supply controller 602 via an isolator circuit 626 because the gate drive adapter circuit 608 is not referenced to the same voltage as the power supply controller 602. Instead the gate drive adapter circuit 608 is referenced to the voltage at the source terminal of the high-side silicon carbide power transistor 604, and driver high voltage bias supply (e.g., 20 volts) is provided to the gate drive adapter circuit 608 via the transformer bias winding 628 and the rectification diode 630. The isolator circuit 626 may be a capacitive isolation circuit. The silicon carbide transistor drive signal 622 generated by the gate drive adapter circuit 608 may swing from about −5 volts to about 20 volts (relative to the voltage at the source terminal of the high-side silicon carbide power transistor 604) to efficiently drive the high-side silicon carbide power transistor 604.

The gate drive adapter circuit 610 is coupled to the power supply controller 602. The gate drive adapter circuit 610 is referenced to the voltage at the source terminal of the low-side silicon carbide power transistor 606, and driver high voltage bias supply (e.g., 20 volts) is provided to the gate drive adapter circuit 610 via the transformer bias winding 632 and the rectification diode 634. The silicon carbide transistor drive signal 624 generated by the gate drive adapter circuit 610 may swing from about −5 volts to about 20 volts (relative to the voltage at the source terminal of the low-side silicon carbide power transistor 606) to efficiently drive the low-side silicon carbide power transistor 606. In some implementations, the gate drive adapter circuit 610 may be referenced to a same ground as the power supply controller 602.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A silicon-carbide transistor adapter, comprising:
   an input terminal;
   an output terminal;
   a capacitor, comprising:
      a first terminal; and
      a second terminal;
   a first transistor comprising:
      a base terminal coupled to the input terminal;
      an emitter terminal coupled to the output terminal; and a collector terminal coupled to the second terminal of
the capacitor;
a second transistor, comprising:
a base terminal coupled to the input terminal; and
an emitter terminal coupled to the first terminal of the capacitor; and
a third transistor comprising:
a gate terminal coupled to the input terminal;
an drain terminal coupled to:
a silicon carbide high-side power rail;
the base terminal of the first transistor; and
the base terminal of the second transistor.

2. The silicon-carbide transistor adapter of claim 1, further comprising a Zener diode coupled to:
a source terminal of the third transistor; and
the second terminal of the capacitor.

3. The silicon-carbide transistor adapter of claim 1, further comprising: a fourth transistor comprising:
a gate terminal coupled to the signal input terminal;
an source terminal coupled to a silicon transistor driver high-side power rail; and
a drain terminal coupled to the gate terminal of the third transistor.

4. The silicon-carbide transistor adapter of claim 1, further comprising:
a fourth transistor comprising:
a base terminal coupled to the input terminal;
a collector terminal coupled to a silicon carbide high-side power rail; and
an emitter terminal coupled to the output terminal, and to the emitter terminal of the second transistor.

\* \* \* \* \*